(12) United States Patent
Kronholz et al.

(10) Patent No.: US 8,969,190 B2
(45) Date of Patent: Mar. 3, 2015

(54) METHODS OF FORMING A LAYER OF SILICON ON A LAYER OF SILICON/GERMANIUM

(75) Inventors: Stephan Kronholz, Dresden (DE); Joachim Patzer, Langebrueck (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 7 days.

(21) Appl. No.: 13/593,614

(22) Filed: Aug. 24, 2012

(65) Prior Publication Data

US 2014/0057415 A1 Feb. 27, 2014

(51) Int. Cl.
*H01L 21/44* (2006.01)

(52) U.S. Cl.
USPC ........... 438/607; 438/44; 438/199; 257/19; 257/204; 257/371; 257/410; 257/210; 257/224; 257/243

(58) Field of Classification Search
CPC .............................. H01L 29/78; H01L 27/092
USPC .............. 438/607, 44, 199; 257/19, 204, 371, 257/410, 210, 224, 243
See application file for complete search history.

(56) References Cited

U.S. PATENT DOCUMENTS

| | | | |
|---|---|---|---|
| 8,071,442 B2 | 12/2011 | Kronholz et al. | |
| 8,124,467 B2 | 2/2012 | Kronholz et al. | |
| 2006/0258126 A1* | 11/2006 | Shiono et al. | 438/493 |
| 2010/0044754 A1* | 2/2010 | Boyanov et al. | 257/192 |
| 2010/0164014 A1 | 7/2010 | Kronholz et al. | |
| 2010/0164016 A1 | 7/2010 | Kronholz et al. | |
| 2010/0164020 A1 | 7/2010 | Kronholz et al. | |
| 2010/0289114 A1 | 11/2010 | Kronholz et al. | |

* cited by examiner

*Primary Examiner* — Kyoung Lee
*Assistant Examiner* — Ratisha Mehta
(74) *Attorney, Agent, or Firm* — Amerson Law Firm, PLLC

(57) ABSTRACT

Disclosed herein are various methods of forming a layer of silicon on a layer of silicon/germanium. In one example, a method disclosed herein includes forming a silicon/germanium material on a semiconducting substrate, after forming the silicon/germanium material, performing a heating process to raise a temperature of the substrate to a desired silicon formation temperature while flowing a silicon-containing precursor and a chlorine-containing precursor into the deposition chamber during the heating process, and, after the temperature of the substrate reaches the desired silicon formation temperature, forming a layer of silicon on the silicon/germanium material.

24 Claims, 5 Drawing Sheets

METHODS OF FORMING A LAYER OF SILICON ON A LAYER OF SILICON/GERMANIUM

BACKGROUND OF THE INVENTION

1. Field of the Invention

Generally, the present disclosure relates to the manufacture of sophisticated semiconductor devices, and, more specifically, to various methods of forming a layer of silicon on a layer of silicon/germanium.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NFET and PFET transistors) represent one important type of circuit element that substantially determines the performance capabilities of the integrated circuits. During the fabrication of complex integrated circuits using, for instance, MOS technology, millions of transistors, e.g., NFET transistors and/or PFET transistors, are formed on a substrate including a crystalline semiconductor layer. A basic field effect transistor comprises a source region, a drain region and a channel region extending between the source and drain regions. Such a transistor further includes a gate insulation layer positioned above the channel region and a gate electrode positioned above the gate insulation layer. When an appropriate voltage is applied to the gate electrode, i.e., a voltage that exceeds the threshold voltage of the transistor, the channel region becomes conductive and current may flow from the source region to the drain region. The gate electrode may be made of a variety of materials, e.g., polysilicon, one or more layers of metal or combinations thereof. The gate structure of the transistor may be made using so-called "gate-first" or "replacement gate" techniques. In one embodiment, the basic structure of a field effect transistor is typically formed by forming various layers of material and thereafter patterning those layers of material using known photolithography and etching processes. Various doped regions, e.g., source regions, drain regions, halo regions, etc., are typically formed by performing one or more ion implantation processes through a patterned mask layer using an appropriate dopant material, e.g., an N-type dopant or a P-type dopant, to implant the desired dopant material into the substrate. The particular dopant selected depends on the specific implant region being formed and the type of device under construction, i.e., an NFET transistor or a PFET transistor. During the fabrication of complex integrated circuits, millions of transistors, e.g., NFET transistors and/or PFET transistors, are formed on a substrate by performing a number of process operations.

In some cases, recessed source/drain regions are formed in the substrate adjacent the gate structure to improve device performance. For example, in PFET transistors, it is common practice to form recessed source/drain regions that are filled with one or more layers of silicon/germanium. Such source/drain regions are also sometimes referred to as "raised" source/drain regions because some of the semiconductor material that is used to form the source/drain regions sometimes is positioned above the upper surface of the substrate, although such a "raised" configuration is not depicted in the attached figures.

Figure 1A:
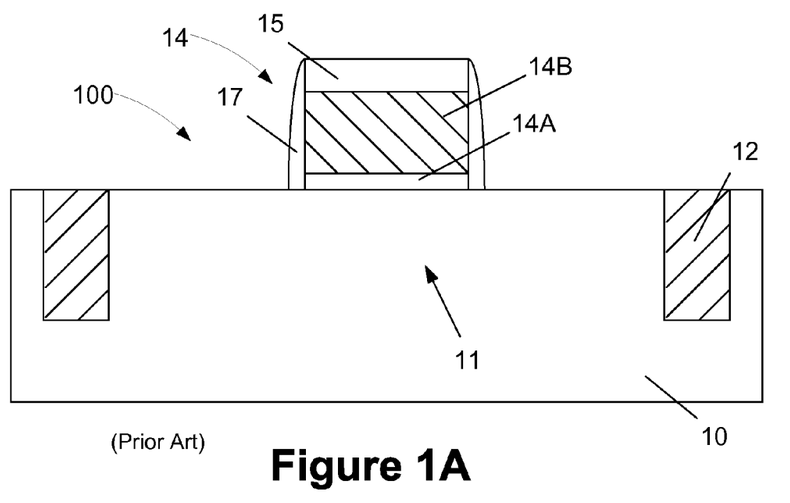
FIGS. 1A-1D depict one illustrative prior art example of forming a transistor device with recessed source/drain regions.

FIGS. 1A-1D depict one illustrative process flow for forming illustrative and simplistically depicted recessed source/drain regions. FIG. 1A is a simplified view of an illustrative transistor 100 at an early stage of manufacturing. The transistor 100 is formed in and above an active region 11 of a semiconducting substrate 10 that is defined by an illustrative trench isolation structure 12 formed in the substrate 10. Several process operations have been performed on the transistor 100 at the point of fabrication depicted in FIG. 1A. Initially, the illustrative isolation structures 12 were formed in the substrate 10 to thereby define the active region 11. Also depicted in FIG. 1A is a gate structure 14 (comprised of an illustrative gate insulation layer 14A and an illustrative gate electrode 14B), a gate cap layer 15 that is formed above the gate electrode 14B, and sidewall spacers 17. Although not depicted in the drawings, at the point of fabrication depicted in FIG. 1A, so-called halo implant regions (not shown) have been formed in the substrate 10, typically by performing an angled ion implant process (with a P-type dopant for an NFET transistor and with an N-type dopant for a PFET transistor) and extension implant regions (not shown) have been formed in the substrate 10 prior to forming the sidewall spacers 17.

Figure 1B:
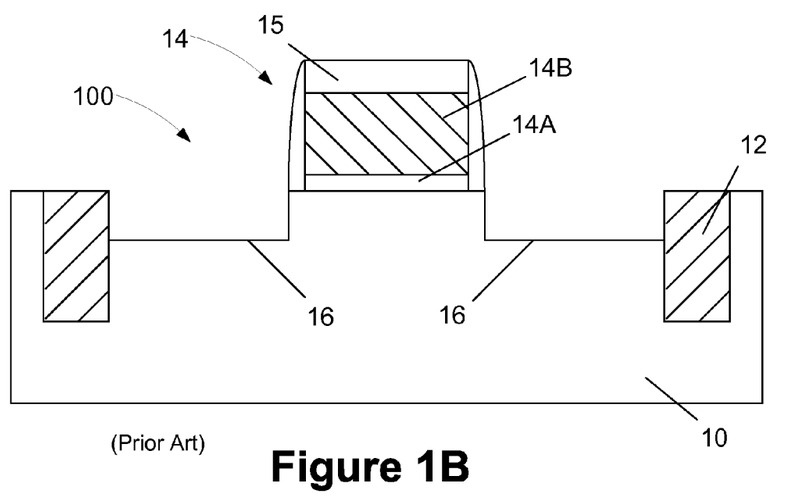

Next, as shown in FIG. 1B, one or more etching processes are performed to define a plurality of recesses or cavities 16 in the substrate 10 proximate the gate structure 14. The depth of the recesses 16 may vary depending on the particular application, e.g., 40-55 nm. Next, as shown in FIG. 1C, one or more layers of a semiconductor material 18, typically silicon/germanium, are formed in the recesses 16 by performing one or more selective epitaxial deposition processes during which a dopant material, such as a P-type dopant material (for a PFET transistor), may be introduced in situ as the layer(s) of semiconductor material 18 is/are being formed.

Figure 1C:
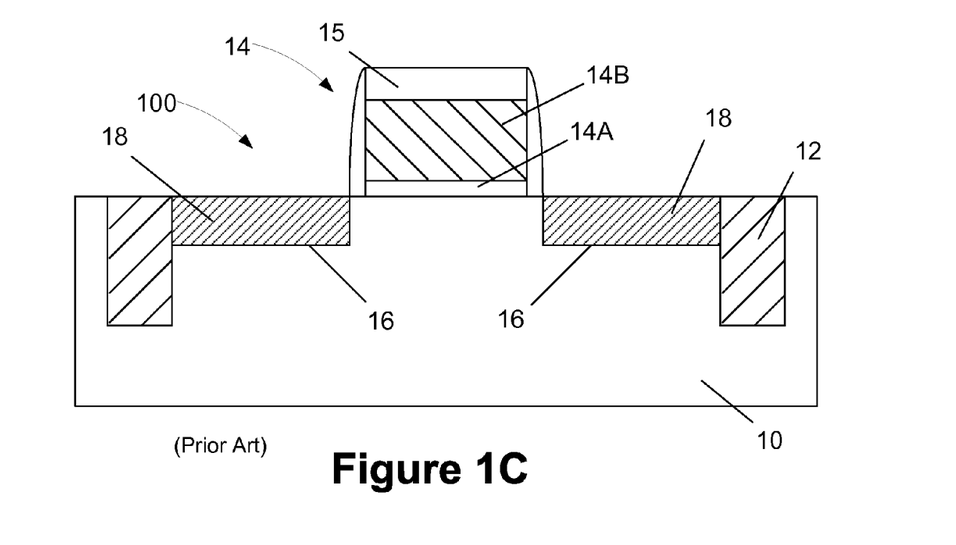

The depiction of the semiconductor material 18 as a block of material in FIG. 1C is intended to be representative of any of a variety of techniques employed to fill the recesses 16 with semiconductor material. For example, in one illustrative embodiment, the semiconductor material 18 may be comprised of a single layer of silicon/germanium with a germanium concentration of about 25%. In another example, the semiconductor material 18 is comprised of two layers of silicon/germanium: a first layer of silicon/germanium having a thickness of about 20-25 nm and a germanium concentration of about 22-25% that is initially formed in the recesses 16; and a second layer of silicon/germanium having a thickness of about 400-500 nm and a germanium concentration of about 30-45% that is formed on the first layer of silicon/germanium. In yet another example, the semiconductor material 18 may be comprised of three layers of silicon/germanium: a first "seed" layer of silicon/germanium having a thickness of about 20-25 nm and a germanium concentration of about 22-25% that is initially formed in the recesses 16; a second layer of silicon/germanium having a thickness of about 40-50 nm and a germanium concentration of about 22-25% that is formed on the first layer of silicon/germanium; and a third layer of silicon/germanium having a thickness of about 5-25 nm and a germanium concentration of about 40% that is formed on the second layer of silicon/germanium. Other process schemes may also be employed to form the schematically depicted semiconductor material 18 in the recesses 16.

Figure 1D:
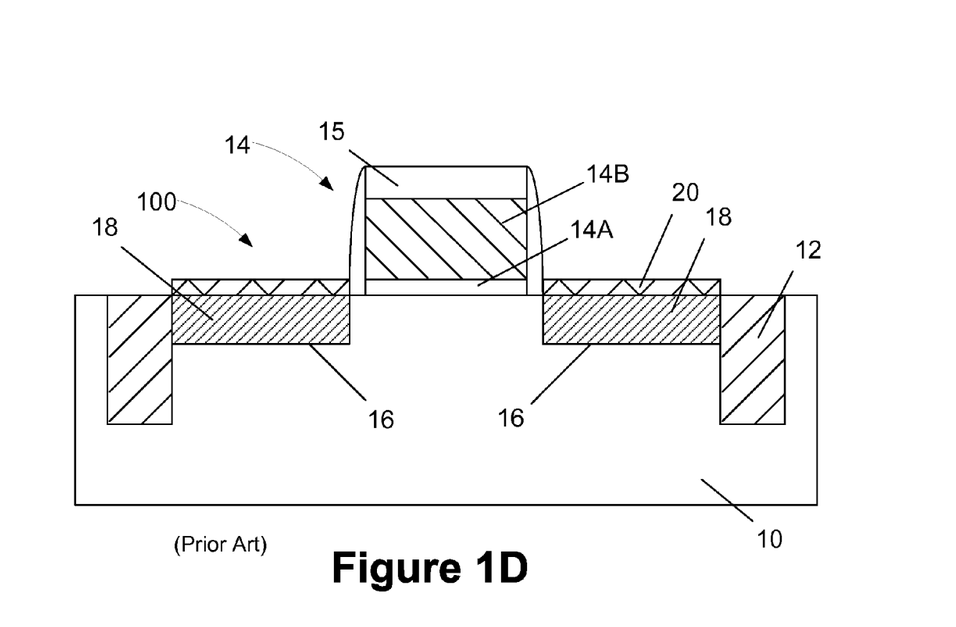

Next, as shown in FIG. 1D, a silicon cap layer 20 is formed above the semiconductor material 18 for a variety of purposes. One purpose of the silicon cap layer 20 is to provide material for the formation of a metal silicide region (not shown) for purposes of reducing the contact resistance between the source/drain region of the transistor and a conductive contact (not shown) that will be formed to establish electrical connection to the source/drain regions. Simply put, there must be a sufficient amount of silicon material 20, e.g., about 20 nm or more, above the source/drain regions at the time the metal silicide formation process is performed so as to enable the formation of a stable metal silicide region. If there is insufficient silicon material 20 when the metal silicide regions are formed, then there is a possibility of producing a transistor device 100 with reduced performance capabilities and/or one that is completely non-functional. Thus, in the case where about 20 nm of silicon is required for proper metal silicide formation, the silicon cap layer 20 may be manufactured "extra thick", e.g., to a thickness of about 30-40 nm, in an attempt to avoid the problems that may occur should there not be enough silicon present during the silicide formation process. In a typical process, the silicon cap layer 20 was formed by performing a epitaxial deposition process at a temperature within the range of about 550-900° C. using, for example, silane as a precursor gas. Typical silicon deposition rates using such a prior art process were relatively low, e.g., about 4-8 Å/sec.

Another problem that device manufacturers have to account for is the fact that the silicon cap layer 20 will be exposed to several additional cleaning and/or etching processes that are performed to manufacture other aspects of the device 100. For example, the layer of silicon 20 may be exposed to cleaning/etching processes that involve use of APM or SC1 (a mixture of ammonia hydroxide, hydrogen peroxide and water). Unfortunately, these additional cleaning and/or etching processes consume portions of the layer of silicon 20. Thus, to insure that there is a sufficient amount of silicon material 20 for the metal silicide formation process, device manufacturers tend to make the layer of silicon 20 relatively thick, e.g., about 40-50 nm, to account for the unavoidable loss of the silicon material during the aforementioned cleaning and/or etching processes. This "solution" is problematic because, given the relatively low deposition rates of silicon noted above, the formation of such relatively thick layers of silicon 20 is a very time-consuming process that is not very well-suited for the high-volume, high-speed production environment that is the norm in the mass production of integrated circuit products.

The present disclosure is directed to various methods that may reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a layer of silicon on a layer of silicon/germanium. In one example, a method disclosed herein includes forming a silicon/germanium material on a semiconducting substrate, after forming the silicon/germanium material, performing a heating process to raise a temperature of the substrate to a desired silicon formation temperature while flowing a silicon-containing precursor and a chlorine-containing precursor into the deposition chamber during the heating process and, after the temperature of the substrate reaches the desired silicon formation temperature, forming a layer of silicon on the silicon/germanium material.

In another example, a method disclosed herein includes performing a first deposition process in a deposition chamber to forming a silicon/germanium material on a semiconducting substrate at a first deposition temperature that falls within the range of about 680-750° C., after forming the silicon/germanium material, performing a heating process to raise the temperature of the substrate to a desired silicon formation temperature that falls within the range of about 750-900° C. while flowing a silicon-containing precursor and a chlorine-containing precursor into the deposition chamber during the heating process and, after the temperature of the substrate reaches the desired silicon formation temperature, forming a layer of silicon on the silicon/germanium material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a layer of silicon on a layer of silicon/germanium. As will be readily apparent to those skilled in the art upon a complete reading of the present application, the layer of silicon may be formed on a layer of silicon/germanium at any level or at any location in an integrated circuit product. Moreover, the present methods and systems may be employed with a variety of different technologies, e.g., PFET, NFET, CMOS, etc., and they are readily applicable to a variety of devices, including, but not limited to, ASICs, logic devices, memory devices, etc. With reference to the attached figures, various illustrative embodiments of the methods disclosed herein will now be described in more detail.

Figure 2:
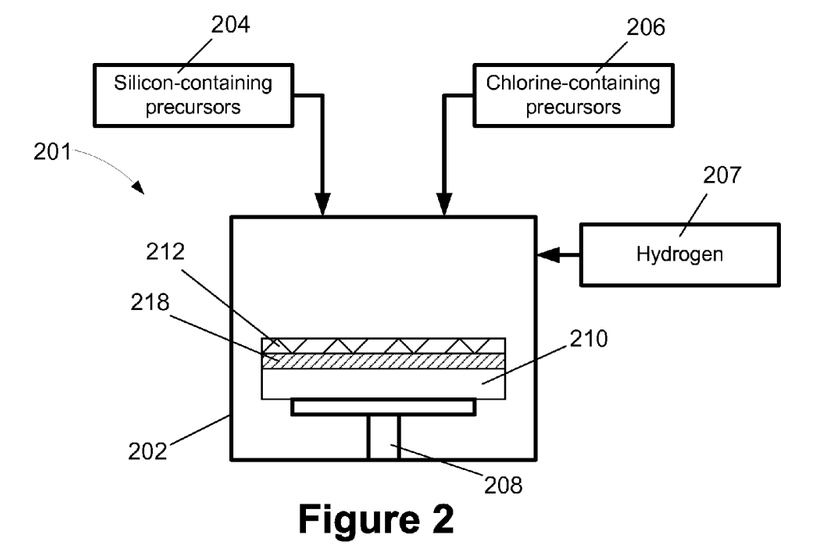
FIGS. 2 and 3 depict one illustrative example of a system and method of forming a layer of silicon above a layer of silicon/germanium as described herein.
Figure 3:
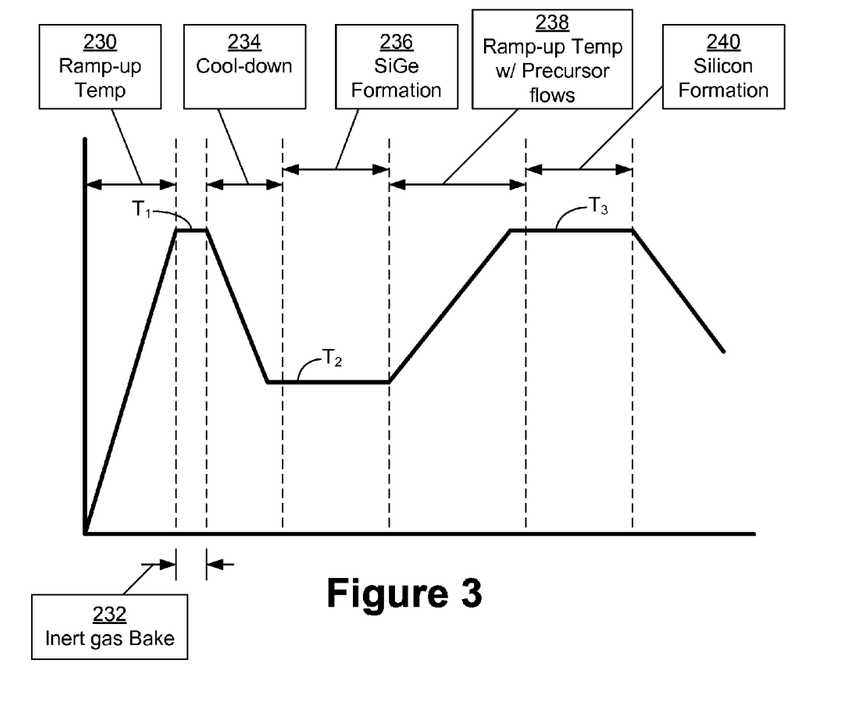

FIG. 2 is an illustrative and schematically depicted embodiment of a deposition system 201 that may be employed to form the various layers of material as described more fully below. FIG. 3 is a temperature profile of an illustrative deposition sequence that may be performed in the system 201 to form a layer of silicon on a layer of silicon/germanium.

As shown in FIG. 2, the system 201 is an epitaxial deposition system that may be employed to form various layers of material. As depicted, a semiconducting substrate 210 is positioned on a wafer stage or pedestal 208 within a processing chamber 202. Also schematically depicted as being operatively coupled to the system 201 is a source of a silicon-containing precursor 204, such as silane ($SiH_4$), dichlorosilane ($H_2SiCl_2$, also known as "DC S"), trichlorsilane, etc., a source of a chlorine-containing precursor 206, such as hydrogen chlorine (HCl), chlorine ($Cl_2$), etc., and a source of inert gas 207, such as hydrogen ($H_2$). Of course, those skilled in the art will appreciate that there are many more components and features in a deposition system that are not depicted in FIG. 2 so as not to make the figure overly complex. For example, the deposition system 201 will also include various valves and pumps, means for heating the process chamber 202, other connections/ports to allow purging of the process chamber 202 from time to time, etc. Thus, the schematic and simplistic depiction of the deposition system 201 should not be considered to be a limitation of the present invention.

At the point depicted in FIG. 2, a layer of silicon 212 has been formed on a layer or region of silicon/germanium material 218. The silicon/germanium material 218 may be formed above the surface of the substrate 210, it may be formed, in whole or part, within one or more recesses (not shown in FIG. 2) formed within the substrate 210 and/or it may be formed as a continuous layer of material, as schematically depicted in FIG. 2. In short, the silicon/germanium material 218 depicted in FIG. 2 is intended to be representative of any form of silicon/germanium material that is formed in, on and/or above the substrate 210, whether or not the silicon/germanium material 218 is a continuous layer of material (as depicted in FIG. 2) or discrete separated regions of silicon/germanium material, e.g., separate regions of silicon/germanium material that are formed as part of spaced-apart source/drain regions of a plurality of transistors (not shown in FIG. 2) that are formed in and above the substrate 210. In some applications, the silicon/germanium material 218 may be comprised of one or more layers of silicon/germanium (in some cases with varying concentrations of germanium in each layer of material). Thus, the phrase "silicon/germanium material" as used in this specification and in the claims should be interpreted to mean any form or shape of silicon/germanium, however it is formed. As one example, the silicon/germanium material 218 may be comprised of the various layers of silicon/germanium that were as described in the background section of this application for the silicon/germanium material 18 and it may have a germanium concentration that falls within the range of about 15-50%. If desired, a dopant material, such as a P-type dopant material (for a PFET transistor), may be introduced in situ as the layer(s) of silicon/germanium material 218 is/are being formed. The silicon/germanium material 218 and the layer 212 may be formed in the same deposition tool, or they may be formed in different deposition tools. For example, in one embodiment, the silicon/germanium material 218 may be formed on the wafer several days prior to the formation of the layer of silicon 212. In other applications, the silicon/germanium material 218 and the layer 212 may be formed in the same deposition tool in a sequential process, whereby various precursor gases and process settings may be changed to form the different layers of material.

FIG. 3 is a temperature profile of one illustrative in situ process flow that may be employed to form the silicon/germanium material 218 and the layer of silicon 212 in the same deposition system 201 in a sequential fashion. In this particular embodiment, the process flow has six distinct periods: a ramp-up temperature period 230; an inert gas-bake period 232; a cool-down period 234; a silicon/germanium formation period 236; a temperature ramp-up while flowing precursor gases period 238; and a silicon formation period 240. As depicted in FIG. 3, the inert gas-bake process is performed with the substrate 210 at or about a temperature "$T_1$," the silicon/germanium formation process is performed with the substrate 210 at or about a temperature "$T_2$" and the silicon formation process is performed with the substrate 210 at or about temperature "$T_3$." The temperature of the substrate 210 may be measured using a variety of techniques and equipment, e.g., thermocouples positioned at or near the center and/or edge region of the substrate 210, optical based temperature measurement systems, etc.

The initial temperature ramp-up period 230 may be accomplished as rapidly as is possible with the system 201. In one example, the initial temperature ramp-up period 230 is performed until the temperature $T_1$ of the substrate 210 falls within the range of about 780-870° C., and, in one particular example, until the temperature $T_1$ of the substrate 210 is about 850° C. At that point, the inert gas-bake process 232 is performed in an inert ambient established in the chamber 202. The inert gas-bake process 232 may be performed for a relatively short duration, e.g., about 60 seconds, to remove native oxides that may be present on the substrate 210. In one specific embodiment, the inert gas-bake process 232 is performed while flowing hydrogen at a flow rate of about 230 sscm for a duration of about 60 seconds while the substrate 210 is at a temperature of about 850° C.

Next, the temperature of the substrate 210 is reduced during the cool-down period 234. This cool-down process 234 proceeds until such time as the temperature $T_2$ of the substrate 210 reaches the desired temperature for formation of silicon/germanium. In one example, the cool-down period 234 is performed until the silicon/germanium formation temperature $T_2$ of the substrate 210 falls within the silicon/germanium formation temperature range of about 680-750° C., and, in one particular example, the temperature $T_2$ is about 730° C. The cool-down period 234 may be performed as rapidly as the system 201 will allow. Next, the silicon/germanium material 218 is formed on the substrate 210 during the silicon/germanium formation period 236 depicted in FIG. 3. As noted above, this silicon/germanium formation process 236 should be understood to be representative of situations where the silicon/germanium material 218 is comprised of either a single or multiple layers of silicon/germanium, and of situations where the germanium concentrations in such silicon/germanium material(s) may be constant or may be varied.

After the silicon/germanium material formation process 236, the temperature ramp-up while flowing precursor gases period 238 is performed to increase the temperature of the substrate 210 to a relatively high silicon formation temperature $T_3$ while a silicon-containing precursor 204, a chlorine-containing precursor 206, and an inert gas 207, e.g., hydrogen, are all flowed into the chamber 202. In one example, the temperature ramp-up while flowing precursor gases period 238 is performed until the substrate 210 reaches a relatively high silicon formation temperature $T_3$ that falls within the range of about 750-900° C., and, in one particular example, the temperature $T_3$ is about 830° C. In one example where the silicon-containing precursor is silane, the chlorine-containing precursor is hydrogen chloride and the inert gas is hydrogen, the follow rates of silane, hydrogen chloride and hydrogen during the process 238 may fall within the range of about 50-500 sscm, depending upon the particular application. Of course, the flow rates of each of these various process gases will likely vary. In one embodiment, the temperature ramp-up while flowing precursor gases period 238 may be performed very rapidly, e.g., over a period of about 10-15 seconds. Thereafter, the layer of silicon 212 is formed on the silicon/germanium material 218 during the silicon formation period 240. The layer of silicon may be formed to any desired thickness, e.g., about 20-30 nm.

Importantly, by performing the temperature ramp-up while flowing precursor gases period 238 described above, the deposition rate of the layer of silicon 212 is dramatically increased relative to prior art deposition rates for silicon material. More specifically, by performing the temperature ramp-up while flowing precursor gases period 238 described above, the layer of silicon 212 may be formed at a deposition rate of about 12-16 Å/sec, which is much faster than the deposition rate of about 4-8 Å/sec for silicon using typical prior art deposition processes such as those described in the background section of this application. Thus, using the novel methods disclosed herein, layers of silicon, such as silicon capping layers, may be formed at deposition rates that are compatible or at least acceptable for high volume semiconductor manufacturing.

Figure 4A:
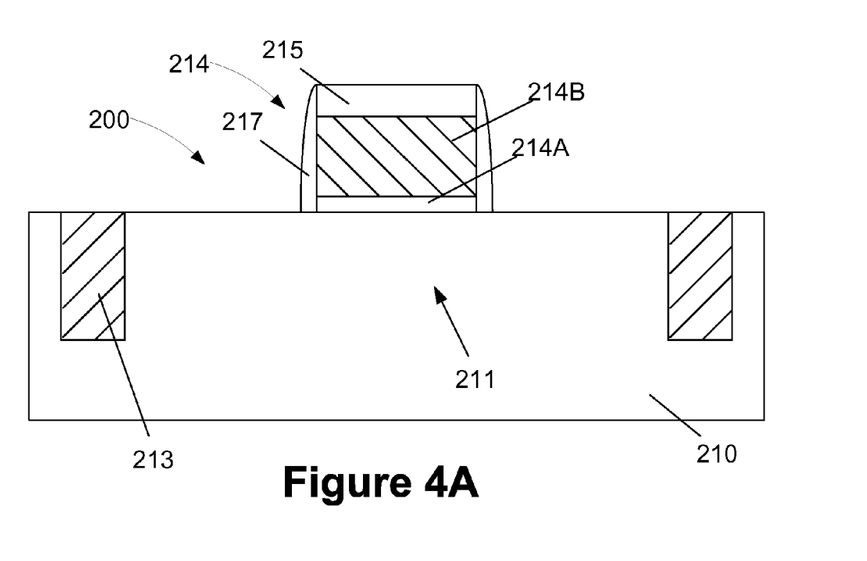
FIGS. 4A-4D depict one specific example wherein the methods disclosed herein may be employed to form a capping layer of silicon above one or more layers of silicon/germanium material that are part of a source/drain region of a transistor.

FIGS. 4A-4D depict one illustrative process flow wherein the silicon layer 212 may be a cap layer that is formed above silicon/germanium material 218 that is part of a source/drain region for a transistor device 200. FIG. 4A is a simplified view of an illustrative transistor 200 at an early stage of manufacturing. The transistor 200 is formed in and above an active region 211 of a semiconducting substrate 210 that is defined by an illustrative trench isolation structure 213 formed in the substrate 210. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all semiconductor structures. The substrate 210 may also be made of materials other than silicon.

With continuing reference to FIG. 4A, the transistor 200 is comprised of a gate structure 214 (comprised of an illustrative gate insulation layer 214A and an illustrative gate electrode 214B), a gate cap layer 215 that is formed above the gate electrode 214B, and illustrative sidewall spacers 17. Although not depicted in the drawings, at the point of fabrication depicted in FIG. 4A, so-called halo implant regions (not shown) have been formed in the substrate 210, typically by performing an angled ion implant process (with a P-type dopant for an NFET transistor and with an N-type dopant for a PFET transistor), and extension implant regions (not shown) have been formed in the substrate 210 prior to forming the sidewall spacers 217. The gate insulation layer 214A may be comprised of a variety of different materials, such as, for example, silicon dioxide, a so-called high-k (k greater than 10) insulation material, etc. Similarly, the gate electrode 214B may also be of a material such as polysilicon or amorphous silicon, or it may be comprised of one or more metal layers that act as the gate electrode 214B. As will be recognized by those skilled in the art after a complete reading of the present application, the gate structure 214 of the transistor 200 depicted in the drawings, i.e., the gate insulation layer 214A and the gate electrode 214B, is intended to be representative in nature. That is, the gate structure 214 may be comprised of a variety of different materials and it may have a variety of configurations, and the gate structure 214 may be made using either so-called "gate-first" or "gate-last" techniques. In some cases, a relatively thin liner layer and/or spacer(s), e.g., spacers 217, may be formed on the gate structure 214. Thus, when it is stated in this specification or the claims that an etching process is performed to define recesses, as described more fully below, in the substrate 210 "proximate" or "adjacent" the gate structure 214, that terminology should be understood to cover situations where a liner and/or spacer(s) is not present as well as situations in which such a liner and/or spacer(s) are present next to the gate structure 214.

Figure 4B:
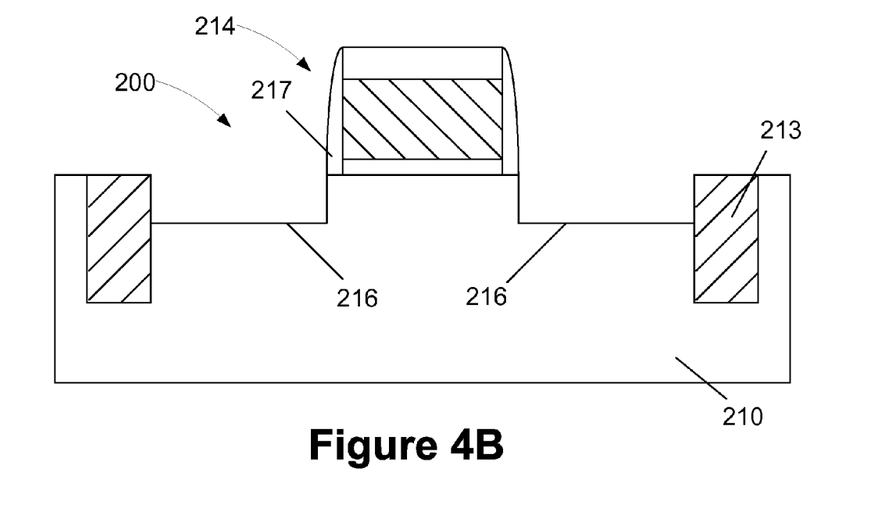

Next, as shown in FIG. 4B, one or more etching processes are performed to define a plurality of recesses or cavities 216 in the substrate 210 proximate the gate structure 214. The depth of the recesses 216 may vary depending on the particular application, e.g., 40-55 nm. In the depicted example, the recesses 216 are formed in a self-aligned manner relative to the spacers 217, although that may not be the case in all applications. For example, it may be the case that the recesses 216 are formed prior to the formation of any liner or spacer adjacent the gate structure 214, or they may be formed after a thin liner layer (not shown) is formed on the gate structure 214 but prior to the formation of the spacers 217. In even other cases, the recesses may not be formed until after an additional liner (not shown) or one or more additional spacers (not shown) are formed on the spacers 217. Thus, when it is stated in this specification or the claims that an etching process is performed to define the recesses 216 in the substrate 210 "proximate" the gate structure 214, that terminology should be understood to cover situations where the recesses 216 are formed in any of the forgoing situations, i.e., without or without a liner and/or a spacer(s) formed adjacent the gate structure 214, as well as situations in which such one or more such liners and/or spacer(s) are present.

Figure 4C:
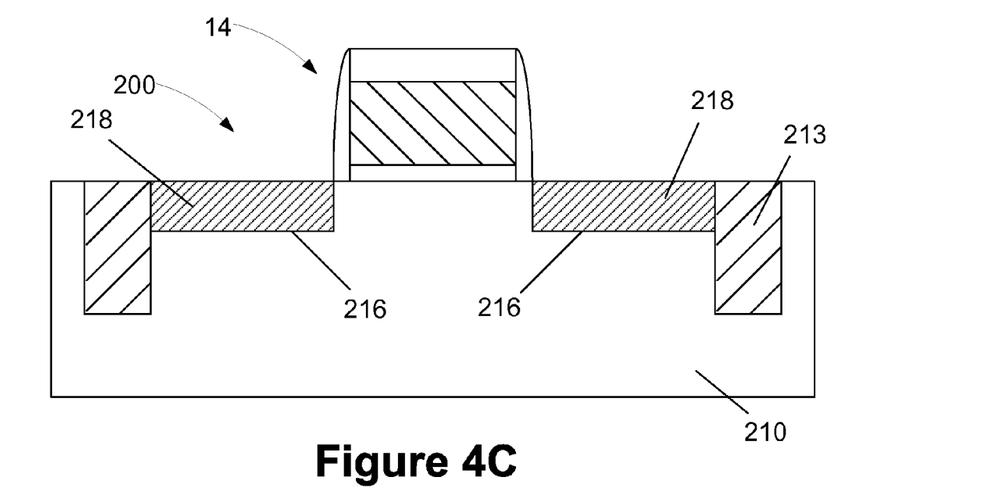

Next, as shown in FIG. 4C, one or more layers of a silicon/germanium material 218 are formed in the recesses 216 by performing one or more selective epitaxial deposition process during which, if desired, a dopant material, such as a P-type dopant material (for a PFET transistor) or an N-type dopant (for an NFET transistor) may be introduced in situ as the layer(s) of silicon/germanium material 218 is being formed. As noted previously, the depiction of the silicon/germanium material 218 as a block or layer of material in FIGS. 2 and 4C (and the additional drawings herein) is intended to be representative of any number of layers of silicon/germanium that may or may not have differing germanium concentrations. The silicon/germanium material 218 may be formed in the recesses 216 using a variety of processing schemes, including those identified in the background section of this application. If desired, the silicon/germanium material 218 may be manufactured in such a way so as to impart a desired stress (tensile stress for an NFET transistor or compressive stress for a PFET transistor) on what will become the channel region of the transistor 200. The techniques used to form the silicon/germanium material 218 such that it has the desired stress properties are well known to those skilled in the art.

Figure 4D:
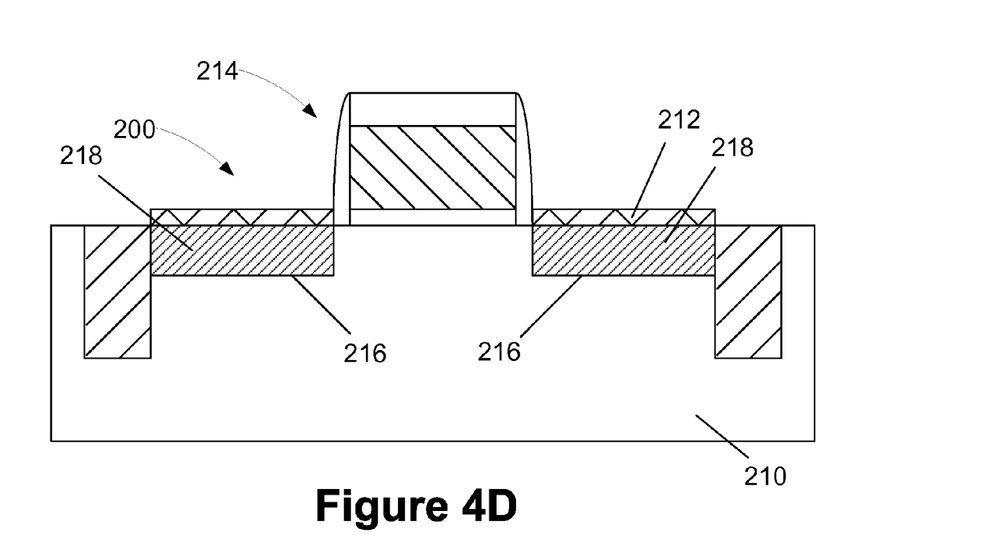

Next, as shown in FIG. 4D, the silicon layer 212 is formed on the silicon/germanium material 218. The silicon layer 212 may be formed by performing a selective epitaxial deposition process as described above in connection with FIGS. 2 and 3, and it may have a thickness that varies depending upon the particular application, e.g., it may have a thickness that falls within the range of about 20-30 nm.

At the point depicted in FIG. 4D, additional processing operations may be performed to complete the fabrication of the transistor device 200, although such additional process operations are not depicted in the drawings. For example, a layer of insulating material may be formed on the device 200, openings for a plurality of conductive contacts may be formed in the layer of insulating material, wherein the openings in the layer of insulating material expose portions of the underlying layer of silicon 212, and one or more etching processes may be performed on the remaining exposed portions of the layer of silicon 212. Then, traditional metal silicide formation processes may be performed to form the metal silicide regions that are conductively coupled to the silicon/germanium material 218 that is positioned under the layer of silicon 212. Conductive contacts are then formed in the openings in the layer of insulating material using traditional techniques. The conductive contacts are conductively coupled to the metal silicide regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
   performing a deposition process in a deposition chamber to form a silicon/germanium material on a semiconducting substrate;
   after forming said silicon/germanium material, performing a heating process to raise a temperature of the substrate to a desired silicon formation temperature while flowing a silicon-containing precursor and a chlorine-containing precursor into said deposition chamber as the temperature of the substrate is being raised during said heating process; and
   after said temperature of said substrate reaches said desired silicon formation temperature, forming a layer of silicon on said silicon/germanium material.

2. The method of claim 1, wherein forming said layer of silicon/germanium comprises forming a single layer of silicon/germanium.

3. The method of claim 1, wherein forming said layer of silicon/germanium comprises forming multiple layers of silicon/germanium.

4. The method of claim 3, wherein each of said multiple layers of silicon/germanium have a different germanium content.

5. The method of claim 1, wherein said silicon/germanium material has a germanium concentration that falls within the range of 15-50%.

6. The method of claim 1, wherein said desired silicon formation temperature falls within the range of about 750-900° C.

7. The method of claim 6, wherein said silicon-containing precursor is comprised of one of silane (SiH4), dichlorosilane (H2SiCl2), or trichlorsilane.

8. The method of claim 7, wherein a flow rate of said silicon-containing precursor falls within the range of about 50-500 sscm.

9. The method of claim 7, wherein said chlorine-containing precursor is comprised of one of hydrogen chlorine (HCl) or chlorine (Cl2).

10. The method of claim 9, wherein a flow rate of said chlorine-containing precursor falls within the range of about 50-500 sscm.

11. The method of claim 1, further comprising flowing hydrogen into said chamber during said heating process.

12. The method of claim 11, wherein a flow rate of said hydrogen falls within the range of about 50-500 sscm.

13. A method of forming a transistor, comprising:
    performing a first deposition process in a deposition chamber to form a silicon/germanium material on a semiconducting substrate at a first deposition temperature that falls within the range of about 680-750° C.;
    after forming said silicon/germanium material, performing a heating process to raise a temperature of said substrate to a desired silicon formation temperature that falls within the range of about 750-900° C. while flowing a silicon-containing precursor and a chlorine-containing precursor into said deposition chamber as the temperature of the substrate is being raised said heating process; and
    after said temperature of said substrate reaches said desired silicon formation temperature, forming a layer of silicon on said silicon/germanium material.

14. The method of claim 13, wherein said silicon/germanium material has a germanium concentration that falls within the range of 15-50%.

15. The method of claim 13, wherein said silicon-containing precursor is comprised of one of silane (SiH4), dichlorosilane (H2SiCl2), or trichlorsilane.

16. The method of claim 15, wherein a flow rate of said silicon-containing precursor falls within the range of about 50-500 sscm.

17. The method of claim 13, wherein said chlorine-containing precursor is comprised of one of hydrogen chlorine (HCl) or chlorine (Cl2).

18. The method of claim 17, wherein a flow rate of said chlorine-containing precursor falls within the range of about 50-500 sscm.

19. The method or claim 17, further comprising flowing hydrogen into said chamber during said heating process.

20. The method of claim 19, wherein a flow rate of said hydrogen falls within the range of about 50-500 sscm.

21. A method of forming a transistor, comprising:
    performing a first deposition process in a deposition chamber to form a silicon/germanium material on a semiconducting substrate at a first deposition temperature that falls within the range of about 680-750° C.;

after forming said silicon/germanium material, performing a heating process to raise a temperature of said substrate to a desired silicon formation temperature that falls within the range of about 750-900° C. while flowing a silicon-containing precursor, a chlorine-containing precursor and hydrogen into said deposition chamber as the temperature of the substrate is being raised during said heating process, wherein a flow rate of said silicon-containing precursor, said chlorine-containing precursor and said hydrogen falls within the range of about 50-500 sscm, 50-500 sscm and 50-500 sscm, respectively; and after said substrate reaches said desired silicon formation temperature, forming a layer of silicon on said silicon/germanium material.

22. The method of claim 21, wherein said silicon/germanium material has a germanium concentration that falls within the range of 15-50%.

23. The method of claim 21, wherein said silicon-containing precursor is comprised of one of silane (SiH4), dichlorosilane (H2SiCl2), or trichlorsilane.

24. The method of claim 21, wherein said chlorine-containing precursor is comprised of one of hydrogen chlorine (HCl) or chlorine (Cl2).

* * * * *

UNITED STATES PATENT AND TRADEMARK OFFICE
CERTIFICATE OF CORRECTION

PATENT NO. : 8,969,190 B2  
APPLICATION NO. : 13/593614  
DATED : March 3, 2015  
INVENTOR(S) : Kronholz et al.

Page 1 of 1

It is certified that error appears in the above-identified patent and that said Letters Patent is hereby corrected as shown below:

In The Claims

In claim 13, at column 10, line 41, after "raised", insert -- during --.

Signed and Sealed this  
Twenty-third Day of June, 2015

Michelle K. Lee  
*Director of the United States Patent and Trademark Office*